US010083761B2

(12) United States Patent
Kim et al.

(10) Patent No.: US 10,083,761 B2
(45) Date of Patent: Sep. 25, 2018

(54) SEMICONDUCTOR DEVICE INCLUDING CHIPS CAPABLE OF COMPARING DATA

(71) Applicant: SK hynix Inc., Icheon-si Gyeonggi-do (KR)

(72) Inventors: Min Chang Kim, Icheon-si (KR); Chang Hyun Kim, Icheon-si (KR); Do Yun Lee, Icheon-si (KR); Jae Jin Lee, Icheon-si (KR); Hun Sam Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/181,495

(22) Filed: Jun. 14, 2016

(65) Prior Publication Data

US 2017/0200481 A1 Jul. 13, 2017

(30) Foreign Application Priority Data

Jan. 7, 2016 (KR) ........................ 10-2016-0001842

(51) Int. Cl.
*G11C 29/38* (2006.01)
*G11C 7/22* (2006.01)
(Continued)

(52) U.S. Cl.
CPC ................ *G11C 29/38* (2013.01); *G11C 7/10* (2013.01); *G11C 7/22* (2013.01); *G11C 2029/2602* (2013.01); *G11C 2029/4002* (2013.01)

(58) Field of Classification Search
CPC ..... G11C 7/22; G11C 7/10; G11C 2029/2602; G11C 29/38; G11C 2029/4002
See application file for complete search history.

(56) References Cited

U.S. PATENT DOCUMENTS 5,305,267 A * 4/1994 Haraguchi ............. G11C 29/46
365/201
8,031,505 B2 * 10/2011 Kang ....................... G11C 5/02
365/51
(Continued)

FOREIGN PATENT DOCUMENTS

KR 1020110075347 A 7/2011

*Primary Examiner* — Vanthu Nguyen
(74) *Attorney, Agent, or Firm* — William Park & Associates Ltd.

(57) ABSTRACT

A semiconductor memory apparatus includes an input/output pad, a first data input/output circuit, a first data transfer circuit, a second data transfer circuit, and a test data comparison circuit. The input/output pad may be coupled to an external equipment. The first data input/output circuit may be coupled to the input/output pad. The first data transfer circuit may transfer data output from the first data input/output circuit to a first data storage region in response to a test write signal and transfer data output from the first data storage region to the first data input/output circuit in response to a test read signal. The second data transfer circuit may transfer data output from the first data input/output circuit to a second data storage region in response to the test write signal and transfer data output from the second data storage region to a second data input/output circuit in response to the test read signal. The test data comparison circuit may generate a test result signal by comparing data output from the first data storage region, the second data storage region, the first data transfer circuit, and the second data transfer circuit and output the test result signal to the external equipment through the input/output pad.

10 Claims, 2 Drawing Sheets

(51) Int. Cl.
*G11C 7/10* (2006.01)
*G11C 29/26* (2006.01)
*G11C 29/40* (2006.01)

(56) References Cited

U.S. PATENT DOCUMENTS

| | | | | |
|---|---|---|---|---|
| 8,325,539 | B2* | 12/2012 | Park | G11C 7/1051 |
| | | | | 365/185.22 |
| 8,780,647 | B2* | 7/2014 | Ishikawa | G01R 31/2884 |
| | | | | 365/189.011 |
| 8,981,808 | B2* | 3/2015 | Nishioka | G11C 5/02 |
| | | | | 257/777 |
| 9,230,609 | B2* | 1/2016 | Frans | G11C 5/02 |
| 9,298,573 | B2* | 3/2016 | Kobla | G06F 11/27 |
| 9,490,032 | B2* | 11/2016 | Byeon | G11C 29/26 |

* cited by examiner

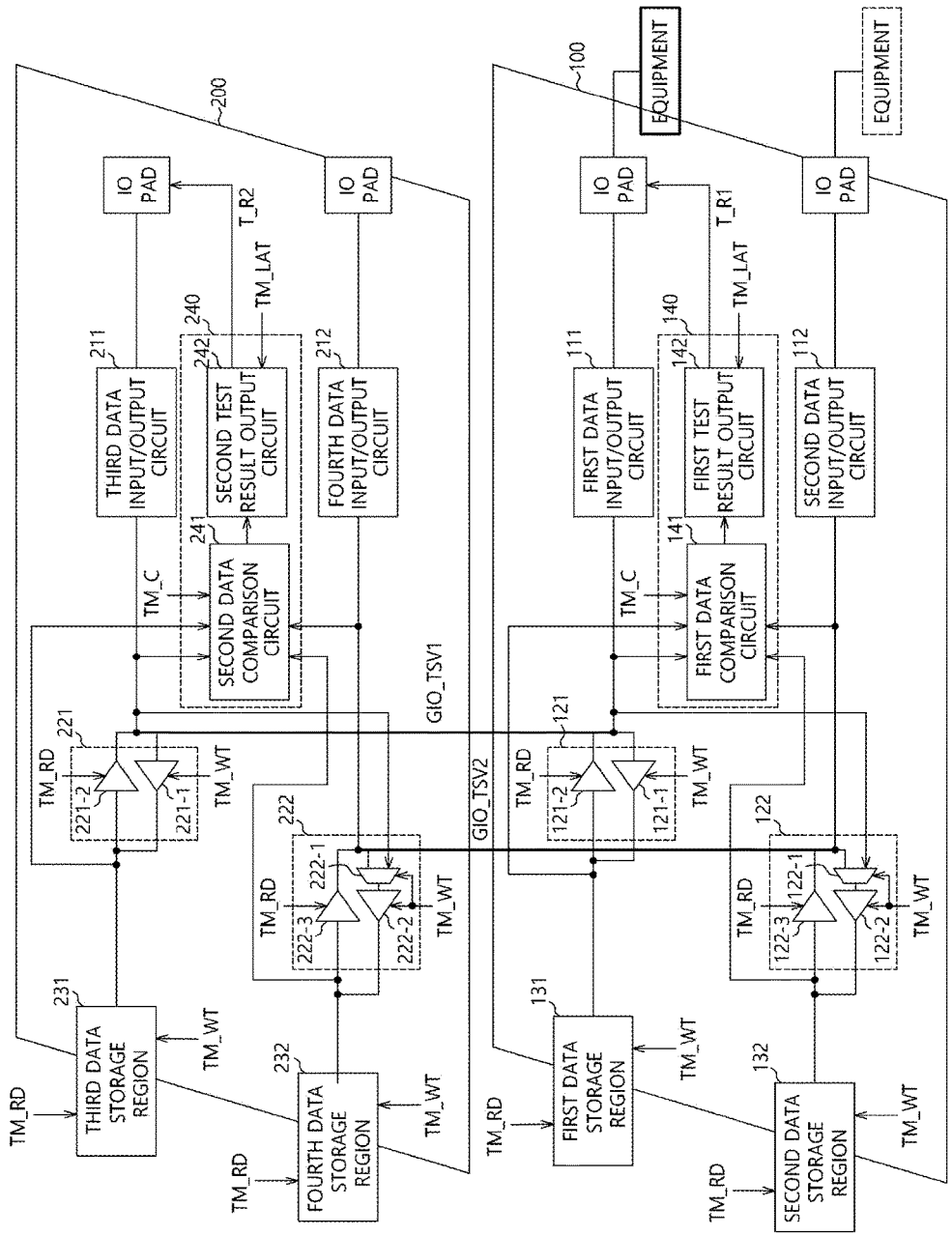

SEMICONDUCTOR DEVICE INCLUDING CHIPS CAPABLE OF COMPARING DATA

CROSS-REFERENCES TO RELATED APPLICATION

This application claims priority under 35 U.S.C. 119(a) to Korean application No. 10-2016-0001842 filed on Jan. 7, 2016, in the Korean intellectual property Office, which is incorporated by reference in its entirety.

BACKGROUND

1. Technical Field

The inventive concept generally relates to a semiconductor integrated circuit, and more particularly to a semiconductor memory apparatus.

2. Related Art

Semiconductor memory apparatuses have been developed to increase data storage capacity.

As the data storage capacity in the semiconductor memory apparatuses is increased, the amount of test time needed to verify the semiconductor memory apparatuses may also be increased.

SUMMARY

According to an embodiment, a semiconductor memory apparatus may include an input/output pad, a first data input/output circuit, a first data transfer circuit, a second data transfer circuit, and a test data comparison circuit. The input/output pad may be coupled to external equipment. The first data input/output circuit may be coupled to the input/output pad. The first data transfer circuit may transfer data output from the first data input/output circuit to a first data storage region in response to a test write signal and transfer data output from the first data storage region to the first data input/output circuit in response to a test read signal. The second data transfer circuit may transfer the data output from the first data input/output circuit to a second data storage region in response to the test write signal and transfer data output from the second data storage region to a second data input/output circuit in response to the test read signal. The test data comparison circuit may generate a test result signal by comparing data output from the first data storage region, the second data storage region, the first data transfer circuit, and the second data transfer circuit and output the test result signal to the external equipment through the input/output pad.

According to an embodiment, a semiconductor memory apparatus may include a first chip and a second chip. The first chip may store data in a first data storage region. The data may be input through an input/output pad. The second chip may store data transferred from the first chip in a second data storage region. The data may be transferred through an interconnect coupling the first and second chips to one another. The first chip may determine whether or not data output from the first data storage region is the same as data output from the second data storage region of the second chip and output a determination result through the input/output pad.

According to an embodiment, a semiconductor memory apparatus may include a first chip and a second chip. The first chip may include a first data storage region and a second data storage region. The second chip may include a third data storage region and a fourth data storage region. The first chip and the second chip may be electrically coupled through a first interconnect and a second interconnect. The first chip may include a first data transfer circuit and a first data input/output circuit configured to transfer data input from an external equipment to the first data storage region or output data output from the first data storage region to the external equipment, and a second data transfer circuit and a second data input/output circuit configured to transfer the data input from the external equipment to the second data storage region or output data output from the second data storage region to the external equipment. The second chip may include a third data transfer circuit configured to transfer data output from the first data input/output circuit to the third data storage region through the first interconnect or transfer data output from the third data storage region to the first chip through the first interconnect and a fourth data transfer circuit configured to transfer the data output from the first data input/output circuit to the fourth data storage region through the second interconnect or transfer data output from the fourth data storage region to the first chip through the second interconnect.

These and other features, aspects, and embodiments are described below in the section entitled "DETAILED DESCRIPTION".

BRIEF DESCRIPTION OF THE DRAWINGS

FIG. 2 is a configuration diagram illustrating a semiconductor memory apparatus according to an embodiment of the inventive concept.

DETAILED DESCRIPTION

Figure 1:
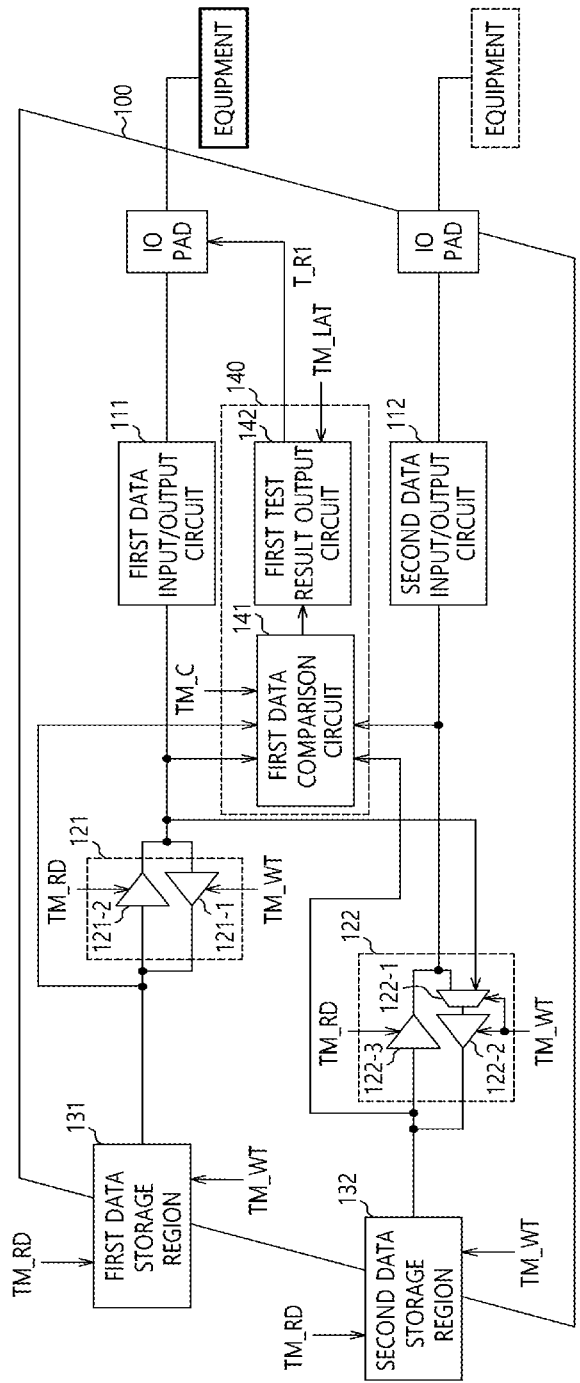
FIG. 1 is a configuration diagram illustrating a semiconductor memory apparatus according to an embodiment of the inventive concept.

Hereinafter, example embodiments will be described in greater detail with reference to the accompanying drawings. Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these example embodiments without departing from the principles and spirit of the inventive concept.

As illustrated in FIG. 1, a semiconductor memory apparatus according to an embodiment may include only a first chip 100.

The first chip 100 may include a first data input/output circuit 111, a second data input/output circuit 112, a first data transfer circuit 121, a second data transfer circuit 122, a first data storage region 131, a second data storage region 132, and a first test data comparison circuit 140.

The first data input/output circuit 111 may receive data from an input/output pad IO PAD coupled to an external equipment and transfer the received data to internal circuits of the semiconductor memory apparatus. The first data input/output circuit 111 may output data from the internal circuits of the semiconductor memory apparatus to the external equipment through the input/output pad IO PAD. For example, the first data input/output circuit 111 may transfer the data received from the input/output pad IO PAD to the first data transfer circuit 121. The first data input/output circuit 111 may also output data output from the first data transfer circuit 121 to the external equipment through the input/output pad IO PAD. More specifically, the first data input/output circuit 111 may be convert serial data received from the external equipment to parallel data and transfer the converted parallel data to the first data transfer circuit 121. Alternatively, the first data input/output circuit 111 may convert parallel data output from the first data transfer circuit 121 to serial data and output the converted serial data to the external equipment through the input/output pad IO PAD.

The second data input/output circuit 112 may receive data from the input/output pad IO PAD coupled to an external equipment and transfer the received data to internal circuits of the semiconductor memory apparatus. The second data input/output circuit 112 may output data from the internal circuits of the semiconductor memory apparatus to the external equipment through the input/output pad IO PAD. For example, the second data input/output circuit 112 may transfer the data received from the input/output pad IO PAD to the second data transfer circuit 122. The second data input/output circuit 112 may also output data output from the second data transfer circuit 122 to the external equipment through the input/output pad I/O PAD. More specifically, the second data transfer circuit 112 may convert serial data received from the external equipment to parallel data and transfer the converted parallel data to the second data input/output circuit 122. Alternatively, the second data transfer circuit 112 may convert parallel data output from the second data transfer circuit 122 to serial data and output the converted serial data to the external equipment through the input/output pad IO PAD.

The first data transfer circuit 121 may transfer the data output from the first data input/output circuit 111 to the first data storage region 131 in response to a test write signal TM_WT and transfer data output from the first data storage region 131 to the first data input/output circuit 111 in response to a test read signal TM_RD. For example, in response to the test write signal TM_WT enabled, the first data transfer circuit 121 may transfer data output from the first data input/output circuit 111 to the first data storage region 131 by amplifying the data signal output from the first data input/output circuit 111. In response to the test read signal TM_RD enabled, the first data transfer circuit 121 may transfer data transferred from the first data storage region 131 to the first data input/output circuit 111 by amplifying the data signal transferred from the first data storage region 131. The first data transfer circuit 121 may transfer the data output from the first data storage region 131 to the first data input/output circuit 111 by amplifying the data signal output from the first data storage region 131 in response to the test read signal TM_RD disabled.

The first data transfer circuit 121 may include a first driver 121-1 and a second driver 121-2. In response to the test write signal TM_WT enabled, the first driver 121-1 may transfer the data output from the first data input/output circuit 111 to the first data storage region 131 by amplifying the data signal output from the first data input/output circuit 111. In response to the test read signal TM_RD enabled, the second driver 121-2 may transfer the data output from the first data storage region 131 to the first data input/output circuit 111 by amplifying the data signal output from the first data storage region 131. The second driver 121-2 may transfer the data output from the first data storage region 131 to the first data input/output circuit 111 by amplifying the data signal output from the first data storage region 131 in response to the test read signal TM_RD disabled.

The second data transfer circuit 122 may transfer data output from one of the first data input/output circuit 111 and the second data input/output circuit 112 to the second data storage region 132 in response to the test write signal TM_WT, and may transfer data output from the second data storage region 132 to the second data input/output circuit 112 in response to the test read signal TM_RD. For example, the second data transfer circuit 122 may transfer the data output from the first data input/output circuit 111 to the second data storage region 132 by amplifying the data signal output from the first data input/output circuit 111 in response to the test write signal TM_WT enabled, and may transfer the data output from the second data input/output circuit 112 to the second data storage region 132 by amplifying the data signal output from the second data input/output circuit 112 in response to the test write signal TM_WT disabled. The second data transfer circuit 122 may transfer the data transferred from the second data storage region 132 to the second data input/output circuit 112 by amplifying the data signal transferred from the second data storage region 132 in response to the test read signal TM_RD enabled. The second data transfer circuit 122 may transfer the data transferred from the second data storage region 132 to the second data input/output circuit 112 in response to the test read signal TM_RD disabled.

The second data transfer circuit 122 may include a first multiplexer 122-1 and third and fourth drivers 122-2 and 122-3. The first multiplexer 122-1 may output one of output signals of the first and second data input/output circuits 111 and 112 to the third driver 122-2 in response to the test write signal TM_WT. For example, in response to the test write signal TM_WT enabled, the first multiplexer 122-1 may output the data output from the first data input/output circuit 111 to the third driver 122-2. In response to the test write signal TM_WT disabled, the first multiplexer 122-1 may output the data output from the second data input/output circuit 112 to the third driver 122-2. In response to the test write signal TM_WT enabled, the third driver 122-2 may transfer the data output from the first multiplexer 122-1 to the second data storage region 132 by amplifying the data signal output from the first multiplexer 122-1. In response to the test read signal TM_RD enabled, the fourth driver 122-3 may transfer the data output from the second data storage region 132 to the second data input/output circuit 112 by amplifying the data signal output from the second data storage region 132. The fourth driver 122-3 may transfer the data output from the second data storage region 132 to the second data input/output circuit 112 by amplifying the data signal output from the second data storage region 132 in response to the test read signal TM_RD disabled.

The first data storage region 131 may receive the data output from the first data transfer circuit 121 and store the received data therein in response to the test write signal TM_WT. The first data storage region 131 may output the data stored therein to the first data transfer circuit 121 in response to the test read signal TM_RD. For example, in response to the test write signal TM_WT enabled, the first data storage region 131 may receive the data output from the first data transfer circuit 121 and store the received data therein, and in response to the test read signal TM_RD enabled, the first data storage region 131 may output the data stored therein to the first data transfer circuit 121.

The second data storage region 132 may receive the data output from the second data transfer circuit 122 and store the received data therein in response to the test write signal TM_WT. The second data storage region 132 may output the data stored therein to the second data transfer circuit 122 in response to the test read signal TM_RD. For example, in response to the test write signal TM_WT enabled, the second data storage region 132 may receive the data output from the second data transfer circuit 122 and store the received data therein, and in response to the test read signal TM_RD enabled, the second data storage region 132 may output the data stored therein to the second data transfer circuit 122.

The first test data comparison circuit 140 may generate a first test result signal T_R1 by comparing all the data transferred from the first data storage region 131, the second data storage region 132, the first data transfer circuit 121, and the second data transfer circuit 122 and output the generated first test result signal T_R1 to the external equipment through the input/output pad IO PAD in response to a data comparison enable signal TM_C and a test latch signal TM_LAT. For example, in response to the test comparison enable signal TM_C enabled, the first test data comparison circuit 140 may determine whether or not all the logic values of the data output from the first and second data storage regions 131 and 132 and the first and second data transfer circuits 121 and 122 are the same as each other, and may output a determination result as the first test result signal T_R1 in response to the test latch signal TM_LAT enabled.

The first test data comparison circuit 140 may include a first data comparison circuit 141 and a first test result output circuit 142.

The first data comparison circuit 141 may compare the data output from the first and second data storage regions 131 and 132 and the first and second data transfer circuits 121 and 122 in response to the data comparison enable signal TM_C. For example, in response to the data comparison enable signal TM_C enabled, the first data comparison circuit 141 may determine whether or not all the logic values of the data output from the first and second data storage regions 131 and 132 and the first and second data transfer circuits 121 and 122 are the same as each other. In an embodiment, the first data comparison circuit 141 may include an exclusive OR gate.

The first test result output circuit 142 may temporarily store an output signal of the first data comparison circuit 141 in response to the test latch signal TM_LAT and output the stored signal as the first test result signal TM_R1. For example, in response to the test latch signal TM_LAT enabled, the first test result output circuit 142 may hold (latch) the output signal of the first data comparison circuit 141 and output the latched signal as the first test result signal TM_R1. The first test result output circuit 142 may include a latch circuit.

An operation of the semiconductor memory apparatus having the above-described configuration will be described below.

The input/output pad IO PAD coupled to the first data input/output circuit 111 may be coupled to the external equipment to test the semiconductor memory apparatus. Alternatively, an input/output pad IO PAD coupled to the second data input/output circuit 112 may be coupled to the external equipment to test the semiconductor memory apparatus. Alternatively, all the input/output pads IO PAD coupled to the first and second data input/output circuits 111 and 112 may be coupled to the external equipment to test the semiconductor memory apparatus.

Hereinafter it is assumed that the semiconductor memory apparatus is coupled to the external equipment through the input/output pad IO PAD coupled to the first data input/output circuit 111.

In order to test the semiconductor apparatus with the external equipment, the test write signal TM_WT may be enabled, and data output from the external equipment may be stored in the first and second data storage regions 131 and 132.

The first data input/output circuit 111 may receive the data output from the external equipment through the input/output pad IO PAD and transfer the received data to the first and second data transfer circuits 121 and 122.

In response to the test write signal TM_WT enabled, the first data transfer circuit 121 may transfer the data output from the first data input/output circuit 111 to the first data storage region 131 by amplifying the data signal output from the first data input/output circuit 111.

In response to the test write signal TM_WT enabled, the first data storage region 131 may receive the data output from the first data transfer circuit 121 and store the received data therein.

In response to the test write signal TM_WT enabled, the second data transfer circuit 122 may transfer the data output from the first data input/output circuit 111 to the second data storage region 132 by amplifying the data signal output from the first data input/output circuit 111.

In response to the test write signal TM_WT enabled, the second data storage region 132 may receive the data output from the second data transfer circuit 122 and store the received data therein.

Next, the test read signal TM_RD may be enabled, and in response thereto operations for outputting data stored in the first and second data storage regions 131 and 132 and comparing the output data may be performed.

The first data storage region 131 may output the data stored therein in response to the test read signal TM_RD enabled. The data output from the first data storage region 131 may be transferred to the first data transfer circuit 121 and the first test data comparison circuit 140.

The second data storage region 132 may output the data stored therein in response to the test read signal TM_RD enabled. The data output from the second data storage region 132 may be transferred to the second data transfer circuit 122 and the first test data comparison circuit 140.

The first data transfer circuit 121 may transfer the data output from the first data storage region 131 to the first data input/output circuit 111 and the first test data comparison circuit 140 in response to the test read signal TM_RD enabled.

The second data transfer circuit 122 may transfer the data output from the second data storage region 132 to the second data input/output circuit 112 and the first test data comparison circuit 140 in response to the test read signal TM_RD enabled.

The first test data comparison circuit 140 may receive all the data output from the first and second data storage regions 131 and 132 and the first and second data transfer circuits 121 and 122. In response to the data comparison enable signal TM_C enabled, the first test data comparison circuit 140 may determine whether or not all the logic values of the data output from the first and second data storage regions 131 and 132 and the first and second data transfer circuits 121 and 122 are the same as each other. In response to the test latch signal TM_LAT enabled, the first test data comparison circuit 140 may temporarily store a result of the determination as to whether or not all the data output from the first and second data storage regions 131 and 132 and the first and second data transfer circuits 121 and 122 are the same as each other, and may output the stored result as the first test result signal T_R1. The first test result signal T_R1 may be transferred to the external equipment through the input/output pad IO PAD coupled to the first data input/output circuit 111.

The semiconductor memory apparatus according to an embodiment may store data input from the external equipment through one input/output pad in different data storage regions, determine whether or not all the data stored in the different data storage regions are the same as each other, and output a determination result to the external equipment through the input/output pad through which the data was input from the external equipment. The semiconductor memory apparatus may simultaneously perform a test for the data storage region and a test for a data transfer circuit by determining whether or not the data from the different data storage regions and the data transferred through the data transfer circuits are the same as each other.

The semiconductor memory apparatus according to an embodiment may include a first chip 100 and a second chip 200 as illustrated in FIG. 2. The first and second chips 100 and 200 may be coupled to one another by one or more interconnects. For example, the first and second chips 100 and 200 may be stacked and electrically coupled through a through silicon via (TSV).

The first chip 100 may include the first data input/output circuit 111, the second data input/output circuit 112, the first data transfer circuit 121, the second data transfer circuit 122, the first data storage region 131, the second data storage region 132, and the first test data comparison circuit 140.

The first data input/output circuit 111 may receive data from an input/output pad IO PAD coupled to the external equipment and transfer the received data to the internal circuits of the semiconductor memory apparatus or to output data from the internal circuits of the semiconductor memory apparatus to the external equipment through the input/output pad IO PAD. For example, the first data input/output circuit 111 may transfer the data received from the input/output pad IO PAD to the first data transfer circuit 121 or may output the data output from the first data transfer circuit 121 to the external equipment through the input/output pad IO PAD. More specifically, the first data input/output circuit 111 may convert serial data received from the external equipment to parallel data and transfer the converted parallel data to the first data transfer circuit 121. The first data input/output circuit 111 may also convert parallel data output from the first data transfer circuit 121 to serial data and output the converted serial data to the external equipment through the input/output pad IO PAD.

The second data input/output circuit 112 may receive data from the input/output pad IO PAD coupled to the external equipment and transfer the received data to the internal circuits of the semiconductor memory apparatus or may output data from the internal circuits of the semiconductor memory apparatus to the external equipment through the input/output pad IO PAD. For example, the second data input/output circuit 112 may transfer the data received from the input/output pad IO PAD to the second data transfer circuit 122 or may output the data output from the second data transfer circuit 122 to the external equipment through the input/output pad I/O PAD. More specifically, the second data input/output circuit 112 may convert serial data received from the external equipment to parallel data and transfer the converted parallel data to the second data transfer circuit 122 or may convert the parallel data output from the second transfer circuit 122 to serial data and output the converted serial data to the external equipment through the input/output pad IO PAD.

The first data transfer circuit 121 may transfer the data output from the first data input/output circuit 111 to the first data storage region in response to the test write signal TM_WT and transfer the data output from the first data storage region 131 to the first data input/output circuit 111 in response to the test read signal TM_RD. For example, in response to the test write signal TM_WT enabled, the first data transfer circuit 121 may transfer the data output from the first data input/output circuit 111 to the first data storage region 131 by amplifying the data signal output from the first data input/output circuit 111, and in response to the test read signal TM_RD disabled, the first data transfer circuit 121 may transfer the data transferred from the first data storage region 131 to the first data input/output circuit 111 by amplifying the data signal transferred from the first data storage region 131.

The first data transfer circuit 121 may include the first driver 121-1 and the second driver 121-2. In response to the test write signal TM_WT enabled, the first driver 121-1 may transfer the data output from the first data input/output circuit 111 to the first data storage region 131 by amplifying the data signal output from the first data input/output circuit 111. In response to the test read signal TM_RD disabled, the second driver 121-2 may be activated and transfer the data output from the first data storage region 131 to the first data input/output circuit 111 by amplifying the data signal output from the first data storage region 131. In response to the test read signal TM_RD enabled, the second driver 121-2 may be inactivated and may not transfer the data output from the first data storage region 131.

The second data transfer circuit 122 may transfer data output from one of the first data input/output circuit 111 and the second data input/output circuit 112 to the second data storage region 132 in response to the test write signal TM_WT, and may transfer data output from the second data storage region 132 to the second data input/output circuit 112 in response to the test read signal TM_RD. For example, the second data transfer circuit 122 may transfer the data output from the first data input/output circuit 111 to the second data storage region 132 by amplifying the data signal output from the first data input/output circuit 111 in response to the test write signal TM_WT enabled, and may transfer the data output from the second data input/output circuit 112 to the second data storage region 132 by amplifying the data signal output from the second data input/output circuit 112 in response to the test write signal TM_WT disabled. The second data transfer circuit 122 may transfer the data output from the second data storage region 132 to the second data input/output circuit 112 by amplifying the data signal output from the second data storage region 132 in response to the test read signal TM_RD disabled.

The second data transfer circuit 122 may include a first multiplexer 122-1 and third and fourth drivers 122-2 and 122-3. The first multiplexer 122-1 may output one of output signals of the first and second data input/output circuits 111 and 112 to the third driver 122-2 in response to the test write signal TM_WT. For example, in response to the test write signal TM_WT enabled, the first multiplexer 122-1 may output the data output from the first data input/output circuit 111 to the third driver 122-2. In response to the test write signal TM_WT disabled, the first multiplexer 122-1 may output the data output from the second data input/output circuit 112 to the third driver 122-2. In response to the test write signal TM_WT enabled, the third driver 122-2 may transfer the data output from the first multiplexer 122-1 to the second data storage region 132 by amplifying the data signal output from the first multiplexer 122-1. In response to the test read signal TM_RD disabled, the fourth driver 122-3 may be activated and transfer the data output from the second data storage region 132 to the second data input/output circuit 112 by amplifying the data signal output from the second data storage region 132. In response to the test read signal TM_RD enabled, the fourth driver 122-3 may be inactivated and may not transfer the data output from the second data storage region 132.

The first data storage region 131 may receive the data output from the first data transfer circuit 121 and store the received data therein in response to the test write signal TM_WT. The first data storage region 131 may output the data stored therein to the first data transfer circuit 121 in response to the test read signal TM_RD. For example, in response to the test write signal TM_WT enabled, the first data storage region 131 may receive the data output from the first data transfer circuit 121 and store the received data therein, and in response to the test read signal TM_RD enabled, the first data storage region 131 may output the data stored therein to the first data transfer circuit 121.

The second data storage region 132 may receive the data output from the second data transfer circuit 122 and store the received data therein in response to the test write signal TM_WT. The second data storage region 132 may output the data stored therein to the second data transfer circuit 122 in response to the test read signal TM_RD. For example, in response to the test write signal TM_WT enabled, the second data storage region 132 may receive the data output from the second data transfer circuit 122 and store the received data therein, and in response to the test read signal TM_RD enabled, the second data storage region 132 may output the data stored therein to the second data transfer circuit 122.

The first test data comparison circuit 140 may generate the first test result signal T_R1 by comparing all the data transferred from the first data storage region 131, the second data storage region 132, the first data transfer circuit 121, and the second data transfer circuit 122, and output the generated first test result signal T_R1 to the external equipment through the input/output pad IO PAD in response to the data comparison enable signal TM_C and the test latch signal TM_LAT. For example, in response to the test comparison enable signal TM_C enabled, the first test data comparison circuit 140 may determine whether or not all the logic values of the data output from the first and second data storage regions 131 and 132 and the first and second data transfer circuits 121 and 122 are the same as each other, and may output a determination result as the first test result signal T_R1 in response to the test latch signal TM_LAT enabled.

The first test data comparison circuit 140 may include the first data comparison circuit 141 and the first test result output circuit 142.

The first data comparison circuit 141 may compare the data output from the first and second data storage regions 131 and 132 and the first and second data transfer circuits 121 and 122 in response to the data comparison enable signal TM_C. For example, in response to the data comparison enable signal TM_C enabled, the first data comparison circuit 141 may determine whether or not all the logic values of the data output from the first and second data storage regions 131 and 132 and the first and second data transfer circuits 121 and 122 are the same as each other. In an embodiment, the first data comparison circuit 141 may include an exclusive OR gate.

The first test result output circuit 142 may temporarily store an output signal of the first data comparison circuit 141 in response to the test latch signal TM_LAT and output the stored signal as the first test result signal TM_R1. For example, in response to the test latch signal TM_LAT enabled, the first test result output circuit 142 may hold (latch) the output signal of the first data comparison circuit 141 and output the latched signal as the first test result signal TM_R1. The first test result output circuit 142 may include a latch circuit.

The second chip 200 may include a third data input/output circuit 211, a fourth data input/output circuit 212, a third data transfer circuit 221, a fourth data transfer circuit 222, a third data storage region 231, a fourth data storage region 232, and a second test data comparison circuit 240.

The third data input/output circuit 211 may receive data from an input/output pad IO PAD coupled to an external apparatus (not illustrated) and transfer the received data to the internal circuits of the semiconductor memory apparatus or to output data from the internal circuits of the semiconductor memory apparatus to the external equipment through the input/output pad IO PAD. For example, the third data input/output circuit 211 may transfer the data received from the input/output pad IO PAD to the third data transfer circuit 221 or may output the data output from the third data transfer circuit 221 to the external equipment through the input/output pad IO PAD. More specifically, the third data input/output circuit 211 may convert serial data received from the external equipment to parallel data and transfer the converted parallel data to the third data transfer circuit 221. The third data input/output circuit 211 may also convert parallel data output from the third data transfer circuit 221 to serial data and output the converted serial data to the external equipment through the input/output pad IO PAD.

The fourth data input/output circuit 212 may receive data from the input/output pad IO PAD coupled to the external apparatus and transfer the received data to the internal circuits of the semiconductor memory apparatus or to output data from the internal circuits of the semiconductor memory apparatus to the external equipment through the input/output pad IO PAD. For example, the fourth data input/output circuit 212 may transfer the data received from the input/output pad IO PAD to the fourth data transfer circuit 222 or to output data output from the fourth data transfer circuit 222 to the external equipment through the input/output pad I/O PAD. More specifically, the fourth data input/output circuit 212 may convert serial data received from the external equipment to parallel data and transfer the converted parallel data to the fourth data transfer circuit 222 or may convert parallel data output from the fourth data transfer circuit 222 to serial data and output the converted serial data to the external equipment through the input/output pad IO PAD.

The third data transfer circuit 221 may transfer data output from the third data input/output circuit 211 to the third data storage region 231 in response to the test write signal TM_WT and to transfer data output from the third data storage region 231 to the third data input/output circuit 211 in response to the test read signal TM_RD. For example, in response to the test write signal TM_WT enabled, the third data transfer circuit 221 may transfer the data output from the third data input/output circuit 211 to the third data storage region 231 by amplifying the data signal output from the third data input/output circuit 211, and in response to the test read signal TM_RD enabled, the third data transfer circuit 221 may transfer data transferred from the third data storage region 231 to the third data input/output circuit 211 by amplifying the data signal transferred from the third data storage region 231.

The third data transfer circuit 221 may include a fifth driver 221-1 and a sixth driver 221-2. In response to the test write signal TM_WT enabled, the fifth driver 221-1 may transfer the data output from the third data input/output circuit 211 to the third data storage region 231 by amplifying the data signal output from the third data input/output circuit 211. In response to the test read signal TM_RD is enabled, the sixth driver 221-2 may transfer the data output from the third data storage region 231 to the third data input/output circuit 211 by amplifying the data signal output from the third data storage region 231.

The fourth data transfer circuit 222 may transfer data output from one of the third data input/output circuit 211 and the fourth data input/output circuit 212 to the fourth data storage region 232 in response to the test write signal TM_WT, and may transfer data output from the fourth data storage region 232 to the fourth data input/output circuit 212 in response to the test read signal TM_RD. For example, the fourth data transfer circuit 222 may transfer the data output from the third data input/output circuit 211 to the fourth data storage region 232 by amplifying the data signal output from the third data input/output circuit 211 in response to the test write signal TM_WT enabled, and may transfer the data output from the fourth data input/output circuit 212 to the fourth data storage region 232 by amplifying the data signal output from the fourth data input/output circuit 212 in response to the test write signal TM_WT disabled. In response to the test read signal TM_RD enabled, the fourth driver 222 may transfer the data transferred from the fourth data storage region 232 to the fourth data input/output circuit 212 by amplifying the data signal transferred from the fourth data storage region 232.

The fourth data transfer circuit 222 may include a second multiplexer 222-1 and seventh and eighth drivers 222-2 and 222-3. The second multiplexer 222-1 may output one of output signals of the third and fourth data input/output circuits 211 and 212 to the seventh driver 222-2 in response to the test write signal TM_WT. For example, in response to the test write signal TM_WT enabled, the second multiplexer 222-1 may output the data output from the third data input/output circuit 211 to the seventh driver 222-2. In response to the test write signal TM_WT disabled, the second multiplexer 222-1 may output the data output from the fourth data input/output circuit 212 to the seventh driver 222-2. In response to the test write signal TM_WT enabled, the seventh driver 222-2 may transfer the data output from the second multiplexer 222-1 to the fourth data storage region 232 by amplifying the data signal output from the second multiplexer 222-1. In response to the test read signal TM_RD enabled, the eighth driver 222-3 may transfer data output from the fourth data storage region 232 to the fourth data input/output circuit 212 by amplifying the data signal output from the fourth data storage region 232.

The third data storage region 231 may receive the data output from the third data transfer circuit 221 and store the received data therein in response to the test write signal TM_WT. The third data storage region 231 may output the data stored therein to the third data transfer circuit 221 in response to the test read signal TM_RD. For example, in response to the test write signal TM_WT enabled, the third data storage region 231 may receive the data output from the third data transfer circuit 221 and store the received data therein, and in response to the test read signal TM_RD is enabled, the third data storage region 231 may output the data stored therein to the third data transfer circuit 221.

The fourth data storage region 232 may receive the data output from the fourth data transfer circuit 222 and store the received data therein in response to the test write signal TM_WT. The fourth data storage region 232 may output the data stored therein to the fourth data transfer circuit 222 in response to the test read signal TM_RD. For example, in response to the test write signal TM_WT enabled, the fourth data storage region 232 may receive the data output from the fourth data transfer circuit 222 and store the received data therein, and in response to the test read signal TM_RD enabled, the fourth data storage region 232 may output the data stored therein to the fourth data transfer circuit 222.

The second test data comparison circuit 240 may generate a second test result signal T_R2 by comparing all the data transferred from the third data storage region 231, the fourth data storage region 232, the third data transfer circuit 221, and the fourth data transfer circuit 222, and output the generated second test result signal T_R2 to the external equipment through the input/output pad IO PAD in response to the data comparison enable signal TM_C and the test latch signal TM_LAT. For example, in response to the test comparison enable signal TM_C enabled, the second test data comparison circuit 240 may determine whether or not all the logic values of the data output from the third and fourth data storage regions 231 and 232 and the third and fourth data transfer circuits 221 and 222 are the same as each other, and may output a determination result as the second test result signal T_R2 in response to the test latch signal TM_LAT enabled.

The second test data comparison circuit 240 may include a second data comparison circuit 241 and a second test result output circuit 242.

The second data comparison circuit 241 may compare the data output from the third and fourth data storage regions 231 and 232 and the third and fourth data transfer circuits 221 and 222 in response to the data comparison enable signal TM_C. For example, in response to the data comparison enable signal TM_C enabled, the second data comparison circuit 241 may determine whether or not all the data output from the third and fourth data storage regions 231 and 232 and the third and fourth data transfer circuits 221 and 222 are the same as each other. In an embodiment, the second data comparison circuit 241 may include an exclusive OR gate.

The second test result output circuit 242 may temporarily store an output signal of the second data comparison circuit 241 in response to the test latch signal TM_LAT and output the stored signal as the second test result signal TM_R2. For example, in response to the test latch signal TM_LAT is enabled, the second test result output circuit 242 may hold (latch) the output signal of the second data comparison circuit 241 and output the latched signal as the second test result signal TM_R2. The second test result output circuit 242 may include a latch circuit.

In the semiconductor memory apparatus having the above-described configuration according to an embodiment, the first and second chips 100 and 200 may be coupled to one another by one or more interconnects. For example, the first chip 100 and the second chip 200 may be electrically coupled through a through silicon via. As illustrated in FIG. 2, the first data transfer circuit 121, the second data transfer circuit 122, the first data comparison circuit 141, and the first data input/output circuit 111 of the first chip 100 may be electronically coupled to the third data transfer circuit 221, the fourth data transfer circuit 222, the second data comparison circuit 241, and the third data input/output circuit 211 of the second chip 200 through a first through silicon via GIO_TSV1. The first data comparison circuit 141 and the second data transfer circuit 122 of the first chip 100 may be electrically coupled to the second data comparison circuit 241 and the fourth data transfer circuit 222 of the second chip 200 through a second through silicon via GIO_TSV2. The first through silicon via GIO_TSV1 may couple an input terminal of the first driver 121-1 and an output terminal of the second driver 121-2 of the first data transfer circuit 121 to an input terminal of the fifth driver 221-1 and an output terminal of the sixth driver 221-2 of the third data transfer circuit 221. The second through silicon via GIO_TSV2 may couple an input terminal of the first multiplexer 122-1 and an output terminal of the fourth driver 122-3 of the second data transfer circuit 122 to an input terminal of the second multiplexer 222-1 and an output terminal of the eighth driver 222-2 of the fourth data transfer circuit 222.

An operation of the semiconductor memory apparatus having the above-described configuration will be described below.

The first chip 100 may be coupled to an external equipment through the input/output pad IO PAD to which the first data input/output circuit 111 of the first chip 100 is coupled.

In order to test the semiconductor apparatus with the external equipment, the test write signal TM_WT may be enabled, and the data output from the external equipment may be stored in the first and second data storage regions 131 and 132 of the first chip 100 and the third and fourth data storage regions 231 and 232 of the second chip 200.

The input/output circuit 111 may receive the data output from the external equipment through the input/output pad IO PAD, and may transfer the received data to the first and second data transfer circuits 121 and 122. The first data input/output circuit 111 may transfer the data to the third and fourth data transfer circuits 221 and 222 of the second chip 200 through the first through silicon via GIO_TSV1.

The first data transfer circuit 121 may transfer the data output from the first data input/output circuit 111 to the first data storage region 131 by amplifying the data signal output from the first data input/output circuit 111 when the test write signal TM_WT is enabled.

When the test write signal TM_WT is enabled, the first data storage region 131 may receive the data output from the first data transfer circuit 121 and store the received data therein.

When the test write signal TM_WT is enabled, the second data transfer circuit 122 may transfer the data output from the first data input/output circuit 111 to the second data storage region 132 by amplifying the data signal output from the first data input/output circuit 111.

In response to the test write signal TM_WT enabled, the second data storage region 132 may receive the data output from the second data transfer circuit 122 and store the received data therein.

In response to the test write signal TM_WT enabled, the third data transfer circuit 221 may receive the data output from the first data input/output circuit 111 through the first through silicon via GIO_TSV1 and transfer the received data to the third data storage region 231 by amplifying the received data signal.

In response to the test write signal TM_WT enabled, the third data storage region 231 may receive the data output from the third data transfer circuit 221 and store the received data therein.

In response to the test write signal TM_WT enabled, the fourth data transfer circuit 222 may receive the data output from the first data input/output circuit 111 through the first through silicon via GIO_TSV1 and transfer the received data to the fourth data storage region 232 by amplifying the received data signal.

In response to the test write signal TM_WT enabled, the fourth data storage region 232 may receive the data output from the fourth data transfer circuit 222 and store the received data therein.

Next, the test read signal TM_RD may be enabled, and in response thereto operations for outputting data stored in the first and second data storage regions 131 and 132 of the first chip 100 and the third and fourth data storage regions 231 and 232 of the second chip 200 and comparing the output data may be performed.

The first data storage region 131 may output the data stored therein in response to the test read signal TM_RD enabled. The data output from the first data storage region 131 may be transferred to the first test data comparison circuit 140 without passing through the first data transfer circuit 121. This is because the second driver 121-2 of the first data transfer circuit 121 is configured to drive the output data of the first data storage region 121 only when the test read signal TM_RD is disabled.

The second data storage region 132 may output the stored data in response to the test read signal TM_RD enabled. The data output from the second data storage region 132 may be transferred to the first test data comparison circuit 140 without passing through the second data transfer circuit 122. This is because the fourth driver 122-3 of the second data transfer circuit 122 is configured to drive the output data of the first data storage region 131 only when the test read signal TM_RD is disabled.

The third data storage region 231 may output the stored data in response to the test read signal TM_RD enabled.

In response to the test read signal TM_RD enabled, the third data transfer circuit 221 may transfer the data output from the third data storage region 231 to the first test data comparison circuit 140 through the first through silicon via GIO_TSV1. In response to the test read signal TM_RD enabled, the sixth driver 222-1 of the third data transfer circuit 221 may output the data output from the third data storage region 231 by amplifying the data signal output from the third data storage region 231.

In response to the test read signal TM_RD enabled, the fourth data storage region 232 may output the stored data therein.

In response to the test read signal TM_RD enabled, the fourth data transfer circuit 222 may transfer the data output from the fourth data storage region 232 to the first test data comparison circuit 140 through the second through silicon via GIO_TSV2. In response to the test read signal TM_RD enabled, the eighth driver 222-3 of the fourth data transfer circuit 222 may output the data output from the fourth data storage region 232 by amplifying the data signal output from the fourth data storage region 132.

The first test data comparison circuit 140 may receive all data output from the first to fourth data storage regions 131, 132, 231, and 232. In response to the data comparison enable signal TM_C enabled, the first test data comparison circuit 140 of the first chip 100 may determine whether or not all the logic values of the data output from the first to fourth data storage regions 131, 132, 231, and 232 are the same as each other. In response to the test latch signal TM_LAT enabled, the first test data comparison circuit 140 may temporarily store a result of the determination as to whether or not all the data output from the first to fourth data storage regions 131, 132, 231, and 232 are the same as each other, and may output the stored signal as the first test result signal T_R1. The first test result signal T_R1 may be transferred to the external equipment through the input/output pad IO PAD coupled to the first data input/output circuit 111.

The semiconductor memory apparatus according to an embodiment may store data input from the external equipment through one input/output pad in different data storage regions, determine whether or not the data stored in the different data storage regions are the same as each other, and output a determination result to the external equipment through the input/output pad through which the data were input from the external equipment. The different data storage regions may be separate semiconductor chips that are electrically coupled to one another through the interconnects such as the through silicon vias.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory apparatus comprising:
a first chip configured to store data in a first data storage region, the data being input through an input/output pad; and
a second chip configured to store data transferred from the first chip in a second data storage region, the data being transferred through an interconnect coupling the first and second chips to one another,
wherein each the first and second chips includes a test comparison circuit which compares data from different storage regions,
wherein the first chip determines whether or not data output from the first data storage region is the same as data output from the second data storage region of the second chip and outputs a determination result through the input/output pad.

2. The semiconductor memory apparatus of claim 1, wherein the interconnect includes a through silicon via, and the first chip and the second chip are stacked and electrically coupled through the through silicon via.

3. The semiconductor memory apparatus of claim 2, wherein the first chip includes:
the input/output pad;
a data input/output circuit coupled to the input/output pad;
a data transfer circuit configured to transfer data output from the data input/output circuit to the first data storage region or transfer data output from the first data storage region to the data input/output circuit; and
the first data storage region configured to store data output from the data transfer circuit or transfer data stored therein to the data transfer circuit,
wherein the through silicon via is coupled to a node to which the data input/output circuit and the data transfer circuit are coupled.

4. The semiconductor memory apparatus of claim 2, wherein the second chip includes:
a data transfer circuit configured to transfer the data transferred from the through silicon via to the second data storage region or transfer the data output from the second data storage region to the first chip through the through silicon via; and
the second data storage region configured to store data output from the data transfer circuit or output data stored therein in the data transfer circuit.

5. The semiconductor memory apparatus of claim 3, wherein the first chip includes the test data comparison circuit configured to determine whether or not the data transferred through the through silicon via is the same as the data output from the first data storage region and outputs the determination result through the input/output pad.

6. The semiconductor memory apparatus of claim 5, wherein the data transfer circuit is inactivated so that the data output from the first data storage region is not driven when it is determined whether or not the data transferred through the through silicon via is the same as the data output from the first data storage region.

7. A semiconductor memory apparatus comprising:
a first chip including a first data storage region and a second data storage region; and
a second chip including a third data storage region and a fourth data storage region,
wherein the first chip and the second chip are electrically coupled through a first interconnect and a second interconnect, and wherein:
the first chip includes a first data transfer circuit and a first data input/output circuit configured to transfer data input from an external equipment to the first data storage region or output data output from the first data storage region to the external equipment, and a second data transfer circuit and a second data input/output circuit configured to transfer the data input from the external equipment to the second data storage region or output data output from the second data storage region to the external equipment; and
the second chip includes a third data transfer circuit configured to transfer data output from the first data input/output circuit to the third data storage region through the first interconnect or transfer data output from the third data storage region to the first chip through the first interconnect and a fourth data transfer circuit configured to transfer the data output from the first data input/output circuit to the fourth data storage region through the second interconnect or transfer data output from the fourth data storage region to the first chip through the second interconnect,
wherein each the first and second chips includes a test comparison circuit which compares data from different storage regions,
wherein the first chip further includes the test data comparison circuit configured to determine whether or not the data output from the first data storage region, the data output from the second data storage region, the data output from the third data storage region through the first through silicon via, and the data output from the fourth data storage region through the second through silicon via are the same as each other, and output a determination result.

8. The semiconductor memory apparatus of claim 7, wherein the first interconnect includes a first through silicon via, and the second interconnect includes a second through silicon via, and the first chip and the second chip are vertically stacked and electrically coupled through the first and second through silicon vias.

9. The semiconductor memory apparatus of claim 8, wherein the first data transfer circuit transfers the data output from the first data input/output circuit to the first data storage region in response to a test write signal, and transfers the data output from the first data storage region to the first data input/output circuit in response to a test read signal.

10. The semiconductor memory apparatus of claim 8, wherein the second data transfer circuit transfers the data output from one of the first and second data input/output circuits to the second data storage region in response to the test write signal, and transfers the data output from the second data storage region to the second data input/output circuit in response to the test read signal.

* * * * *